US009299485B1

(12) United States Patent
Katiyar et al.

(10) Patent No.: US 9,299,485 B1
(45) Date of Patent: Mar. 29, 2016

(54) MICRO AND NANOSCALE MAGNETOELECTRIC MULTIFERROIC LEAD IRON TANTALATE-LEAD ZIRCONATE TITANATE

(71) Applicants: Ram S Katiyar, Guaynabo, PR (US); Ashok Kumar, Delhi (IN); Nora Patricia Ortega, San Juan, PR (US); Dilsom Alberto Sanchez, San Juan, PR (US); James Floyd Scott, Cambridge (GB); Donald Malcolm Evans, Scotland (GB); John Martin Gregg, Northern Ireland (GB)

(72) Inventors: Ram S Katiyar, Guaynabo, PR (US); Ashok Kumar, Delhi (IN); Nora Patricia Ortega, San Juan, PR (US); Dilsom Alberto Sanchez, San Juan, PR (US); James Floyd Scott, Cambridge (GB); Donald Malcolm Evans, Scotland (GB); John Martin Gregg, Northern Ireland (GB)

(73) Assignee: University of Puerto Rico, San Juan, PR (US)

( * ) Notice: Subject to any disclaimer, the term of this patent is extended or adjusted under 35 U.S.C. 154(b) by 0 days.

(21) Appl. No.: 14/511,011

(22) Filed: Oct. 9, 2014

Related U.S. Application Data

(60) Provisional application No. 61/888,507, filed on Oct. 9, 2013.

(51) Int. Cl.
*G11C 11/00* (2006.01)
*H01F 1/03* (2006.01)
*G11C 11/16* (2006.01)
*C23C 14/18* (2006.01)

(52) U.S. Cl.
CPC .............. *H01F 1/0315* (2013.01); *C23C 14/18* (2013.01); *G11C 11/1673* (2013.01); *G11C 11/1675* (2013.01)

(58) Field of Classification Search
CPC ...................................................... G11C 11/00
USPC ......... 365/48, 55, 62, 66, 74, 78, 80–93, 100, 365/130, 131, 148, 158, 171–173, 225.5, 365/243.5; 257/421, E21.665; 438/3; 977/933–935
See application file for complete search history.

(56) References Cited

U.S. PATENT DOCUMENTS

| 7,345,475 | B2* | 3/2008 | Takeuchi | G01R 33/18 324/244 |
|---|---|---|---|---|
| 7,700,985 | B2* | 4/2010 | Xi | G11C 11/22 257/297 |
| 7,719,883 | B2* | 5/2010 | Hochstrat | G11C 11/16 365/158 |
| 8,280,210 | B2* | 10/2012 | Chowdhury | G02F 1/0009 333/239 |
| 2007/0252593 | A1* | 11/2007 | Takeuchi | G01R 33/18 324/249 |

* cited by examiner

*Primary Examiner* — Harry W Byrne
(74) *Attorney, Agent, or Firm* — Hoglund & Pamias, PSC; Roberto J. Rios

(57) ABSTRACT

The invention is a novel class of materials made by combining the best qualities of both lead iron tantalate (PFT) and lead iron titanate (PZT) to synthesize $(PbZr_{0.53}Ti_{0.47}O_3)_{(1-x)}$—$(PbFe_{0.5}Ta_{0.5}O_3)_x$ (PZTFT) ($0.1 \leq x \leq 0.9$) compositions that have multiferroic (ferroelectric and ferromagnetic) and magnetoelectric properties.

13 Claims, 8 Drawing Sheets

(a)　　　　　　　　　　　　(b)

(a)

(b)

MICRO AND NANOSCALE MAGNETOELECTRIC MULTIFERROIC LEAD IRON TANTALATE-LEAD ZIRCONATE TITANATE

BACKGROUND OF THE INVENTION

The anticipated end of Moore's law scaling in microelectronics has stimulated researchers to explore other alternatives i.e. to render the individual components to be multifunctional. One of the promising field in which the researchers have focused in order to explore the multifunctionality of the materials is Magnetoelectric (ME) multiferroics.

(ME) multiferroics are materials which possess simultaneously ferroelectric (FE) and ferromagnetic (FM) properties in the same phase and have coupling between them, that is, the switching of magnetization by electric field or polarization by magnetic field; have had a tremendous research interest due to a number of potential multifunctional applications in modern technologies, like sensor applications and random access memory devices. These ME materials have all the potential applications of their parent FE and FM materials; in addition to having a bifunctional property not available in systems with a single order parameter.

The ideal ME multiferroic materials for device application would be a single phase material with high FE and FM properties, low leakage current, and a strong coupling between FE and FM properties which allow the control of the magnetic properties with electric field and vice-versa, at room temperature. There are several families of the single phase ME multiferroic materials such as i) perovskite oxide structure family (Bismuth compounds, Relaxor, rare earth (RE) manganites (REMnO$_3$), Mixed Perovskite solid solution); ii) Other oxides (REMn$_2$O$_5$ family); iii) Non oxides (phosphates, boracites, fluoride family, spinel chalcogenides, and delafossites). Most of the compounds listed above have drawbacks: i) they are multiferroic at low temperature; ii) they have very low ferroelectric and/or ferromagnetic response; and iii) low value of magnetoelectric coupling constant for practical applications. In case of multiferroic terbium manganites TbMnO$_3$ or TbMn$_2$O$_5$, the inconvenience for practical applications is their weak ferroelectric properties at very low temperature (<40 K). It is two orders of magnitude smaller (<0.1 µC/cm$^2$) than a typical ferroelectric polarization (1-100 µC/cm$^2$).

However, in perovskite oxide structure family, one of the promising Bi compound is BiFeO$_3$ (BFO), which has multiferroic behavior at room temperature, with a remanent polarization ~50-60 µC/cm$^2$, but it exhibits a weak ferromagnetism (1µ$_B$ per unit cell), which makes the cross coupling among these ferroic parameters very weak and also poorly understood. Additional problems with BFO are high leakage current, a tendency to fatigue, and thermal decomposition near the coercive field. In case of relaxors such as Pb(Fe$_{2/3}$W$_{1/3}$)O$_3$ (PFW) and Pb(Fe$_{0.5}$Ta$_{0.5}$)O$_3$ (PFT), they show high temperature multiferroic behavior. One of the reason why single phase oxide multiferroic materials have been reported in small numbers is due to the contra-indication between the conventional mechanism in ferroelectric oxides that requires empty d-orbitals and formation of magnetic moments which results from partially filled d-orbitals. In order to overcome the intrinsic limitations to obtain high magnetoelectric coupling, the efforts of scientists are aimed at synthesizing new single phase material that can produce electric switching of magnetization and magnetic switching of polarization at room temperature with electrical requirements (low leakage current, low fatigue, low loss) that allow its use for practical applications. In this sense, perovskite solid solution method, opens the door to the possibility of finding a desired single phase ME multiferroic material.

SUMMARY OF THE INVENTION

The present invention is an important development in the present state of the art that provides a novel class of materials, by combining the best qualities of both lead iron tantalate (PFT) and lead iron titanate (PZT) to synthesize (PbZr$_{0.53}$Ti$_{0.47}$O$_3$)$_{(1-x)}$—(PbFe$_{0.5}$Ta$_{0.5}$O$_3$)$_x$ (PZTFT) (0.1≤x≤0.9) compositions that have multiferroic (ferroelectric and ferromagnetic) and magnetoelectric properties.

The present invention is related to synthesis of new class of room temperature single phase magnetoelectric multiferroic material (PbZr$_{0.53}$Ti$_{0.47}$O$_3$)$_{(1-x)}$—(PbFe$_{0.5}$Ta$_{0.5}$O$_3$)$_x$ (PZTFT) (0.1≤x≤0.9). The material PFT$_x$-PZT$_{(1-x)}$ was synthesized in both ceramic and thin film by conventional solid state reaction route and pulsed laser deposition technique, respectively. The PZTFT ceramic samples exhibit exceptional properties such as: high dielectric constant (∈~700-1200), low dielectric loss (tan δ~0.04-0.18), well saturated ferroelectric loop with P$_r$~10-20 µC/cm$^2$), well defined ferromagnetic loop with saturate magnetization of about 0.02-0.06 emu/gr, and magnetoelectric effect that was observed with moderate electric control of the magnetization and coercive field. Piezo-force microscopy (PFM) images evidenced changes in ferroelectric domain patterns induced by application of magnetic field. The aforementioned properties make PZTFT family a perfect candidate for room temperature multiferroic devices.

The present invention relates to the synthesis and fabrication of a novel class of room temperature, single phase magnetoelectric thin film of composition (PbZr$_{0.53}$Ti$_{0.47}$O$_3$)$_{(1-x)}$—(PbFe$_{0.5}$Ta$_{0.5}$O$_3$)$_x$ (0.1≤x≤0.9) showing a significant change in magnetization under the application of a modest electric field ±35 kV/cm.

An object of the present invention is to provide a method of fabrication of magnetoelectric multiferroic PZTFT of composition (PbZr$_{0.53}$Ti$_{0.47}$O$_3$)$_{(1-x)}$—(PbFe$_{0.5}$Ta$_{0.5}$O$_3$)$_x$ (0.1≤x≤0.9) that exhibits high dielectric constant, low dielectric loss, ferroelectric, ferromagnetic, and magnetoelectric properties.

Another object of the present invention is to provide an optimized composition (PbZr$_{0.53}$Ti$_{0.47}$O$_3$)$_{(1-x)}$—(PbFe$_{0.5}$Ta$_{0.5}$O$_3$)$_x$, x=0.4-0.5, wherein, the ceramic samples exhibit higher polarization, higher magnetization, and magnetoelectric coupling.

Another object of the invention is to provide an evidence that if we combine PZT of composition (PbZr$_{0.53}$Ti$_{0.47}$O$_3$) and PFT of composition (PbFe$_{0.5}$Ta$_{0.5}$O$_3$) using the solid state method, it results in one single material at the nanoscale level.

An object of the present invention is to provide a family of room-temperature, magnetoelectric multiferroic materials by tailoring compositions of PZTFT (0.1≤x≤0.9), which when inserted in a metallic-insulator-metallic structure, exhibit high dielectric constant, low dielectric loss, high temperature ferroelectric-phase transition (>300 K), low leakage current, and room temperature magnetoelectric effect.

Generally, it is an assumption that if we combine two substances which are magnetic at temperatures T$_1$ and T$_2$, into a single-phase material, the resulting material will be magnetic up to some temperature, T which lies between T$_1$ and T$_2$. However, in the present invention when we mixed PbFe$_{0.5}$Ta$_{0.5}$O$_3$ with T$_1$=150 K, and PbZr$_{(1-x)}$Ti$_x$O$_3$ without magnetic properties, we got a new single phase material $PbZr_{0.53}Ti_{0.47}O_3)_{(1-x)}$—$(PbFe_{0.5}Ta_{0.5}O_3)_x$ with T(magnetic)≈400 K.

The obtained result is contrary to the general expected result and is not obvious for a person skilled in the art. The reason is that $PbFe_{0.5}Ta_{0.5}O_3$ has short-range cluster of magnetic order up to T>400 K. No one previously realized that this could be useful for magnetoelectricity. Since, the composition of the present invention, PZTFT is ferroelectric at room temperature, it becomes the second known single phase room temperature magnetoelectric, after $BiFeO_3$ which exhibits magnetoelectric switching at room temperature (T=295 K).

BRIEF DESCRIPTION OF THE DRAWINGS

Further features and advantages of the invention will become apparent from the following detailed description taken in conjunction with the accompanying figures showing illustrative embodiments of the invention, in which.

Figure 1:
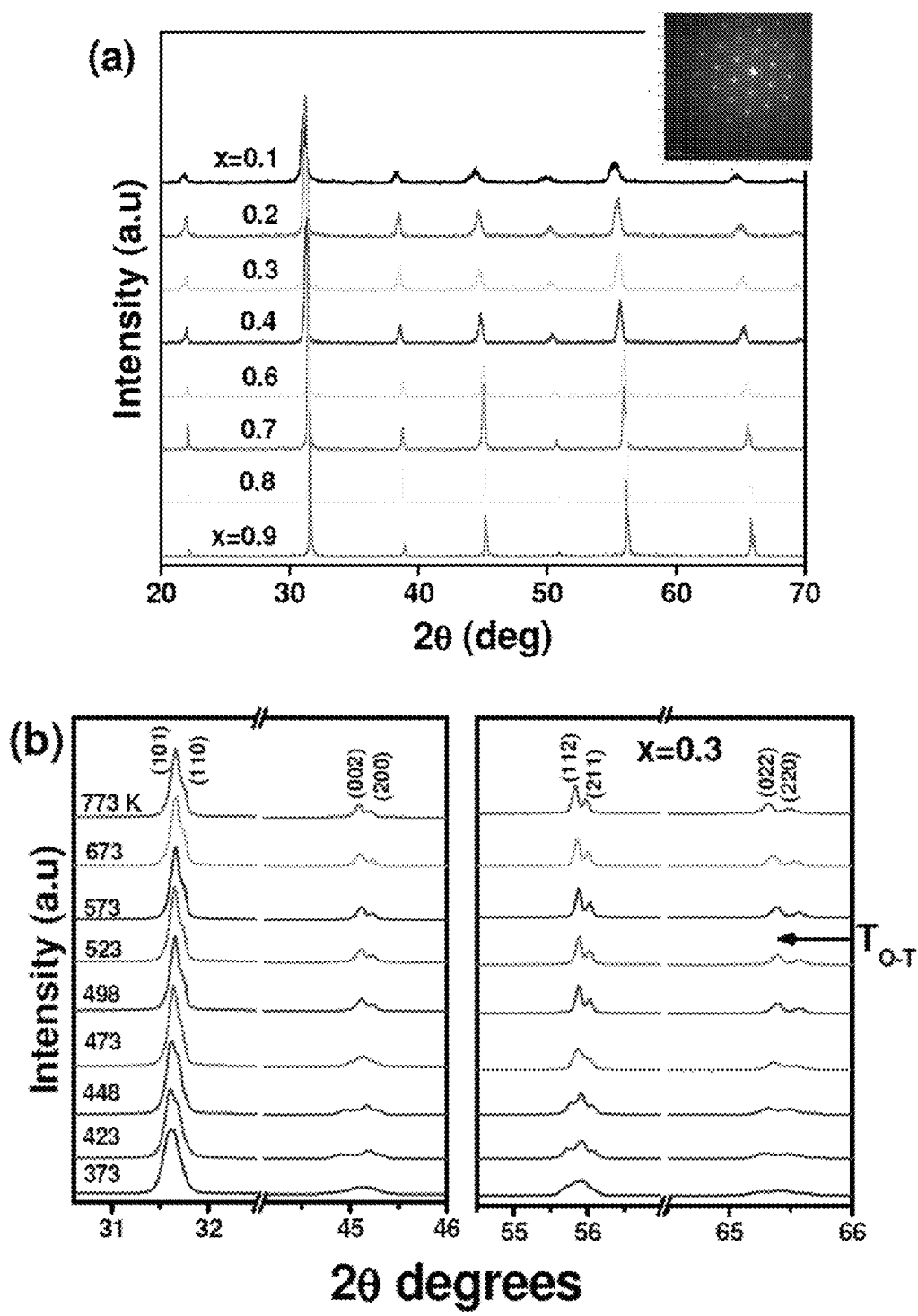
FIG. 1 shows Room temperature x-ray spectra of $(PbZr_{0.53}Ti_{0.47}O_3)_{(1-x)}$—$(PbFe_{0.5}Ta_{0.5}O_3)$ ceramics for different compositions (0.1≤x≤0.9) and temperature dependent x-ray scattering spectra for $PFT_{0.3}$-$PZT_{0.7}$, according to the present invention.

Throughout the figures, the same reference numbers and characters, unless otherwise stated, are used to denote like elements, components, portions or features of the illustrated embodiments. The subject invention will be described in detail in conjunction with the accompanying figures, in view of the illustrative embodiments.

DETAILED DESCRIPTION OF THE INVENTION

The present invention relates to a novel room-temperature, magnetoelectric multiferroics, single-phase material of composition $(PbZr_{0.53}Ti_{0.47}O_3)_{(1-x)}$—$(PbFe_{0.5}Ta_{0.5}O_3)_x$ where, 0.1≤x≤0.9. All the terms used have the same meaning as is used in general aspect of the art, unless otherwise specified. As used hereinafter, the following terms shall have the following definitions: "Magnetoelectric" refers to the effect of induced dielectric polarization change of a material in an applied magnetic field or an induced magnetization change in an external electric field, "Piezoelectricity" refers to the ability of materials to generate an electric field in response to an applied mechanical force, "Relaxor" refers to materials having naturally occurring short-range polar nano-ordered regions and highly frequency-dependent dielectric properties, "Remanent polarization, $P_r$" refers to the net polarization remaining in a ferroelectric material after an externally applied electric field is used to saturate the polarization of the material and then removed, "Coercive E-field," $E_c$ refers to the electric field which is used to switch the polarization to generate the different logic state for memory applications. The E-field frequency is 50 Hertz for the purpose of this description, "$E_{max}$" refers to the maximum electric field that is used for the hysteresis loop measurements, "Leakage current density" (J") refers to the current per unit area, measured as a function of applied electric field, "Polarization fatigue $P_{sw}$" refers to the loss in polarization after certain number of cycles of device utility, "B-site": The general formula for perovskite oxides is $ABO_3$, where specific elements occupy the A and B sites in the crystal lattice, and O is oxygen. For PZTFT, Pb is on the A-site and Fe, Ta, Zr, and Ti share the B-site, "Room temperature" refers to temperature of 296 K, The composite material $(PbZr_{0.53}Ti_{0.47}O_3)_{(1-x)}$—$(PbFe_{0.5}Ta_{0.5}O_3)_x$ is referred to as PZTFT for the purpose of this description. The present invention provides a class of single phase, magnetoelectric multiferroic materials belonging to the perovskite solid solution (PSS) class. PSS is a route to the synthesis of a solid solution of ferroelectric (FE) and ferromagnetic (FM) perovskite-type structure in one single-phase material. In the present material PZT is the piezoelectric/ferroelectric composition and PFT is the magnetic/ferroelectric relaxor composition.

The present invention provides a composition material $(PbZr_{0.53}Ti_{0.47}O_3)_{(1-x)}$—$(PbFe_{0.5}Ta_{0.5}O_3)_x$ (0.1≤x≤0.9) that exhibits improvement in ferroelectric and magnetic properties for x≤0.6, while, well saturated ferroelectricity and ferromagnetic loop are present in the compositions with x≤0.4; though the ferroelectric properties persist until x≥0.9, paramagnetic behavior was observed for x≥0.6. The invention provides a family of room temperature multiferroic composite PZTFT with high Curie temperature suitable for real device application. The effect of variation in x content in $(PbZr_{0.53}Ti_{0.47}O_3)_{(1-x)}$—$(PbFe_{0.5}Ta_{0.5}O_3)_x$ on Curie temperature ($T_c$) (ferroelectric to paraelectric phase transition or ferroelectric-ferroelectric phase transition) is that the $T_c$ value decreases in PZTFT composition with increase of PFT contents, i.e. Tc gradually decreases from 660 K for PZT to 530 K, 470 K and 240 K for $PZT_{0.7}$-$PFT_{0.3}$ (x=0.3), $PZT_{0.6}$-$PFT_{0.4}$ (x=0.4), and PFT, respectively.

The invention provides a material with several sequential phase transitions: cubic-tetragonal (i.e. ca 1300 K), tetragonal-orthorhombic (i.e. 520 K for x=0.3 and 475 K for x=0.4), and to orthorhombic-rhombohedral (i.e. 230 K for x=0.3 and 270 K for x=0.4). A sequence similar to that in barium titanate.

The $(PbZr_{0.53}Ti_{0.47}O_3)_{(1-x)}$—$(PbFe_{0.5}Ta_{0.5}O_3)_x$ (x=0.4) composite material is used in the form of magnetic field sensor and capacitors. The composite exhibits a significant change in remanent magnetization under the application of positive and negative external electric field, and also Piezo-force microscopy (PFM) in presence of magnetic field shows that changes in amplitude and phase are not associated with topography, which suggests that ferroelectric domains change with applied magnetic field.

Ceramic samples of $(PbZr_{0.53}Ti_{0.47}O_3)_{(1-x)}$—$(PbFe_{0.5}Ta_{0.5}O_3)_x$, $(0.1 \leq x \leq 0.9)$ are fabricated by a conventional solid state reaction method, said method comprising steps of: choosing analytical-purity oxides, mixing in high energy ball milling; calcining the ball milled mixture at 850° C. for 10 h to obtain the perovskite phase; and sintering the pressed pellets in a temperature range of 1100-1250° C. for 4 h.

In the solid state reaction route high purity raw materials PbO, $ZrO_2$, $TiO_2$, $Fe_2O_3$ and $Ta_2O_5$ are used to prepare the $(PbZr_{0.53}Ti_{0.47}O_3)_{(1-x)}$—$(PbFe_{0.5}Ta_{0.5}O_3)_x$ $(0.1 \leq x \leq 0.9)$ single phase perovskite composite.

A thin film of composite material $(PbZr_{0.53}Ti_{0.47}O_3)_{(1-x)}$—$(PbFe_{0.5}Ta_{0.5}O_3)_x$ $(0.1 \leq x \leq 0.9)$ is fabricated by a pulsed laser deposition method, said method comprising steps of: providing ceramic targets of $(PbZr_{0.53}Ti_{0.47}O_3)_{(1-x)}$—$(PbFe_{0.5}Ta_{0.5}O_3)_x$, $(0.1 \leq x \leq 0.9)$; depositing a PZTFT $(0.1 \leq x \leq 0.9)$ thin film from the ceramic target on a substrate; annealing the deposited PZTFT $(0.1 \leq x \leq 0.9)$ thin film at 873 K for 60 minutes in oxygen at a pressure of 300 Torr; and cooling the annealed films to 296 K at a rate of 5 K/minute. The PZTFT layer is deposited from the ceramic target at a temperature of 873 K under an oxygen pressure of 200 mTorr using laser energy of 1.5 J/cm² at a repetition rate of 10 Hz. The substrate used is MgO; and the thin film has a total thickness of at least 350 nm.

The ceramic or thin films of composite material $(PbZr_{0.53}Ti_{0.47}O_3)_{(1-x)}$—$(PbFe_{0.5}Ta_{0.5}O_3)_x$ $(0.1 \leq x \leq 0.9)$ can be further covered by conducting material layer or layers to render it suitable for real life applications including ferroelectric Random Access Memories (FeRAMS). The conducting layer can be single or multi-layer and it can be continuous or intermittent. The conducting material includes LSCO, Platinum, LSMO, and/or $SrRuO_3$ (SRO).

A highly oriented thin film of composite PZTFT $(0.1 \leq x \leq 0.9)$ is fabricated by a pulsed laser deposition method (PLD), where the composite layer is deposited from the ceramic targets of PZTFT with 10% excess of lead oxide to a MgO substrate at a deposition temperature of 873 K under a oxygen pressure of 200 mTorr, using a laser energy density of 1.8 J/cm² at a repetition rate of 10 Hz. The total thickness of the obtained films was around 350 nm. The substrate is covered with a conducting layer of $La_{0.67}Sr_{0.33}CoO_3$ (LSCO) having thickness in the range of 60-90 nm deposited using PLD technique.

Stoichiometric ceramic target of PZTFT with 10% excess of lead oxide (to compensate for loss of volatile Pb) were synthesized by a conventional solid-state route. PZTFT film was fabricated by pulsed laser deposition (PLD) employing a KrF excimer laser (X=240 nm). The conducting $La_{0.67}Sr_{0.33}CoO_3$ (LSCO) layer was grown at 873 K under an oxygen pressure of 300 mTorr, using a laser energy density of (1.8 J/cm²) and repetition rate of 10 Hz, followed by normal cooling in oxygen atmosphere. The PZTFT layer was then deposited on the LSCO layer at 873 K under an oxygen pressure of 200 mTorr, using a laser energy density of (1.5 J/cm²) and repetition rate of 10 Hz. After deposition, PZTFT was annealed at 873 K for 60 minutes in oxygen at a pressure of 300 Torr. Finally, the films were cooled down to room temperature at a 5 K/minute. The total thicknesses of the PZTFT films were around 350 nm.

All the composites having composition $(PbZr_{0.53}Ti_{0.47}O_3)_{(1-x)}$—$(PbFe_{0.5}Ta_{0.5}O_3)_x$ $(0.1 \leq x \leq 0.4)$ prepared by the pulsed laser deposition technique are multiferroic at room temperature, that is, they are ferroelectric and ferromagnetic at 300 K. Similar to PZTFT ceramic sample, with increase in x (PFT concentration), the Curie temperature decreases from $T_c$ (~643 K) for pure PZT to lower $T_c$ values. The $T_c$ values for 0.1, 0.2, 0.3, 0.4 of PFT concentration in PZTFT thin films were determined to be 598 K, 566 K, 520 K, and 357 K respectively at 10 kHz. They exhibit well-saturated ferroelectric hysteresis loops with high remanent polarization ($P_r$) of about 43-78 μC/cm² at an external electric field of 600 kV/cm at room temperature. Highest $P_r$ values were found for x=0.2 and 0.3. Even the saturated magnetization for x=0.1 (17 emu/cm³ at 20 kOe) is higher than x=0.4 (6 emu/cm³ at 20 kOe). Higher coercive field ($H_c$) was observed in x=0.4 ($H_c$=0.6 kOe) compared to x=0.1 ($H_c$=0.1 kOe). The films showed good dielectric properties (∈=400-1300). This material appeared to be better than $BiFeO_3$ for devices because it has lower dielectric loss (0.04-0.08).

The present invention provides a room temperature single phase multiferroic $(PbZr_{0.53}Ti_{0.47}O_3)_{(1-x)}$—$(PbFe_{0.5}Ta_{0.5}O_3)_x$ wherein $0.1 \leq x \leq 0.4$ used as room temperature magnetoelectric switch, which implies memory storage with an electric voltage for WRITE operation and magnetic property for READ operation and vice-versa.

The present invention also provides a room temperature single phase multiferroic $(PbZr_{0.53}Ti_{0.47}O_3)_{(1-x)}$—$(PbFe_{0.5}Ta_{0.5}O_3)_x$ wherein $0.1 \leq x \leq 0.4$ thin films for non-volatile memory applications in ferroelectric Random Access Memories (FERAMS). The single-phase thin films of PZTFT of the present invention have high potential for non-volatile memory and multiferroic Random Access Memories (RAM) applications.

EXAMPLE 1

Preparation and Properties of the Ceramic $(PbZr_{0.53}Ti_{0.47}O_3)_{(1-x)}$—$(PbFe_{0.5}Ta_{0.5}O_3)_x$ $(0.1 \leq x \leq 0.9)$ by Solid State Route Materials and Methods Magnetoelectric multiferroic $(PbZr_{0.53}Ti_{0.47}O_3)_{(1-x)}$—$(PbFe_{0.5}Ta_{0.5}O_3)_x$ $(0.1 \leq x \leq 0.9)$ ceramic samples were prepared by a solid-state route. Analytical-purity oxides, PbO (99.5%), $ZrO_2$ (99.86%), $TiO_2$ (99.96%), $Fe_2O_3$ (99.99%) and $Ta_2O_5$ (97%) (Alfa Aesar) were used as raw materials. The powder of the respective metal oxides were mixed in planetary high energy ball mill with tungsten carbide media at a ball-to-powder weigh ratio of 1:3, at a speed of 600 rpm for a period of 16 h, and then it was calcined at 1123 K for 10 h in a closed alumina crucible. 10% excess of PbO was added to each composition to compensate Pb deficiency during the high temperature processing. Poly (vinyl alcohol) solutions (1%) were added to the calcined powders as a binder. The dried powders were granulated by passing them through a 150 μm-mesh sieve and pressed using a hydrostatic press (3.46× $10^8$ Pa) into pellets of 10 mm diameter. The pressed pellets were heat treated at 873 K for the removal of organic binders followed by sintering at 1373 K ($0.5 \leq x \leq 0.9$) and 1523 K ($0.1 \leq x \leq 0.4$) for 4 h. All heat treatments were performed in air. In order to prevent the PbO loss during high temperature sintering and to maintain desired stoichiometric, an equilibrium PbO vapor pressure was established with $PbZrO_3$ as setter by placing pellets in a covered alumina crucible. The flat polished surfaces of the sintered pellets were electrode with high purity silver paint (Du Pont) and then dried at 473 K before making any electrical measurement.

The crystal structure and phase transition of the samples was characterized by x-ray diffraction (XRD) (Bruker D8 Advance system) using $CuK_\alpha$ radiation. A step size 0.01° and scanning speed of 3°/min were chosen. XRD patterns were recorded over the angular range 20°-80° (2θ) with wavelength of λ=1.5405 Å. Variable-temperature XRD measurements was performed in high vacuum using an Anton Paar HTK-1200N high temperature chamber, which is designed to be used in the range from room temperature up to 1300° C. The sample is mounted on an alumina sample holder, and just below the sample the temperature sensor is located. The determination of cell parameters was carried out with DIFFRACplus TOPAS™ software supplied by Bruker. The micro-Raman measurements were performed in the backscattering geometry using the Jobin-Yvon T64000 spectrometer. The excitation radiation of 514.5 nm from a coherent $Ar^+$ laser was focused onto the sample surface. The scattering light was dispersed by samples and collected with a charge coupled device (CCD) detector. The flat polished surfaces of the sintered pellets were electroded with high purity silver paint and then dried at 200° C. before making any electrical measurement. Dielectric measurements (capacitance and loss factor) were performed in the temperature range of 300 K to 600 K for frequencies between 100 Hz to 1 MHz by using a programmable temperature controller (MMR K-20) and an impedance analyzer (HP 4294A). Ferroelectric hysteresis loops were measured using a hysteresis loop tester (Radiant Technologies RT6000 HVS) at 50 Hz in a voltage range from 100 V to 3000 V. Temperature dependent magnetic measurements were carried out using a Quantum Design MPMS XL-7 SQUID magnetometer while, room temperature magnetic measurements were performed using a vibrating sample magnetometer (VSM Lakeshore model 142A). Magnetoelectric coupling was measured at room temperature, depositing conducting $La_{0.67}Sr_{0.33}MnO_3$ (LSMO) on the PZTFT (x=0.3) ceramic. LSMO target was synthesized by a conventional solid-state route. LSMO layer was grown by pulsed laser deposition employing a KrF excimer laser (λ=240 nm) at 700° C. under an oxygen pressure of 80 mTorr, using a laser energy density of (1.8 $J/cm^2$) and repetition rate of 10 Hz, followed by annealing at 700° C. for 30 min in oxygen.

Magnetoelectric response of PZTFT was also studied by piezo force microscope (PFM) technique mapping the change of ferroelectric domain, both in, and after presence of magnetic field.

Results:

X-ray diffraction patterns (XRD) of the $(PbZr_{0.53}Ti_{0.47}O_3)_{(1-x)}$—$(PbFe_{0.5}Ta_{0.5}O_3)_x$ (0.1≤x≤0.9) powders calcined at 1123 K for 10 h and then sintering into ceramic pellets 1373-1523 K for 4 h. In order to obtain the wanted phase, several calcined and sintering temperatures were chosen, the results presented in plot (a) of FIG. 1 corresponding to the best single phase compound evidencing single phase perovskite structure without the appearance of any secondary phase (e.g. pyrochlore). This is an excellent result considering that the center of the of the perovskite octahedral could be occupied randomly by $Ta^{5+}$, $Fe^{3+}$, $Zr^{+4}$ or $Ti^{+4}$, which make difficult to obtain pure perovskite phase. Inset in plot (a) of FIG. 1 show the selected area electron diffraction (SAED) pattern of the ceramic PZTFT, these studies evidence the single phase structure in PZTFT x=0.4 material at nanoscale level.

The combination of the temperature dependence of x-ray, Raman, dielectric and polarization studies, the probable full sequence of phase transition for 40% PFT is: cubic $Pm\bar{3}m$ above 1300 K; tetragonal P4/mm at 460 K<T<1300 K; orthorhombic Pmm2 at 250 K<T<460 K; and rhombohedral or monoclinic (unknown space group) at T<250 K.

The temperature variation XRD show the existence of a structural phase transition in PZTFT systems from orthorhombic (Pmm2 ($C_{2v}$)) to tetragonal (P4 mm ($C_{4v}$)) during heating 520 K for x=0.3 and 475 K for x=0.4) becomes cubic ($Pm\bar{3}m$) above ca. 1300 K.

The criteria we use to determine the space groups mentioned before in tetragonal and orthorhombic phase were: 1) If the space group is polar, 2) If the space group of orthorhombic phase is a subgroup of that of the tetragonal phase. The first criteria was considered taking into account that temperature variation of ferroelectric hysteresis loop of PZTFT x=0.4 show the PZTFT x=0.4 are ferroelectric from room temperature until 550 K.

The evolution of the symmetry with temperature of the PZTFT was also verified by temperature variation Raman spectra of the PZTFT compounds. Clear change in Raman spectra in the vicinity of the phase transition from orthorhombic to tetragonal for PZTFT X=0.3 and x=0.4 at 475 K and 530 K respectively, support he XRD observation. The changes from orthorhombic to tetragonal phase transition are manifested mainly by reduction of the numbers of lines in the respective Raman spectra. A second phase transition from tetragonal to cubic at 1123 K was observed when none of the prominent peaks were observed. Temperature variation of the dielectric permittivity and dielectric loss for PZTFT with 0.1≤x≤0.9 show the curie temperature value of the composition move from higher 600 K to 350 K when the PFT concentration increase from x=1 to x=0.9. The observation of the dielectric maxima peak evidences the ferroelectric-ferroelectric phase transition. The $T_c$ value for x=0.3 and x=0.4 were determined to be 520 K and 475 K respectively, these values are in agree with XRD and Raman spectroscopy results. All the PZTFT compositions show $T_c$ value higher than room temperature, and high dielectric constant, which makes them suitable for transducers and capacitor applications.

Figure 2:
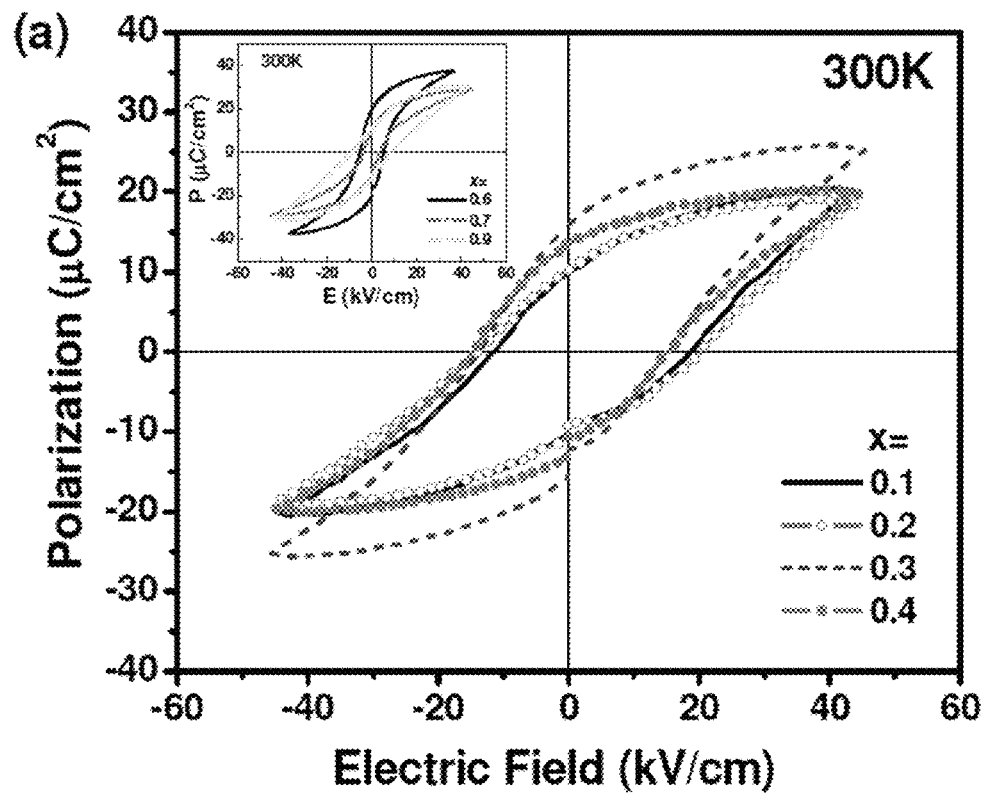
FIG. 2 shows room temperature Polarization (P)—Electric field (E) hysteresis loop of PZTFT for different compositions of ceramic samples and polarization and coercive field of the P-E hysteresis loop for different concentration (x) in PFT-PZT compounds, according to the present invention.
Figure 2:
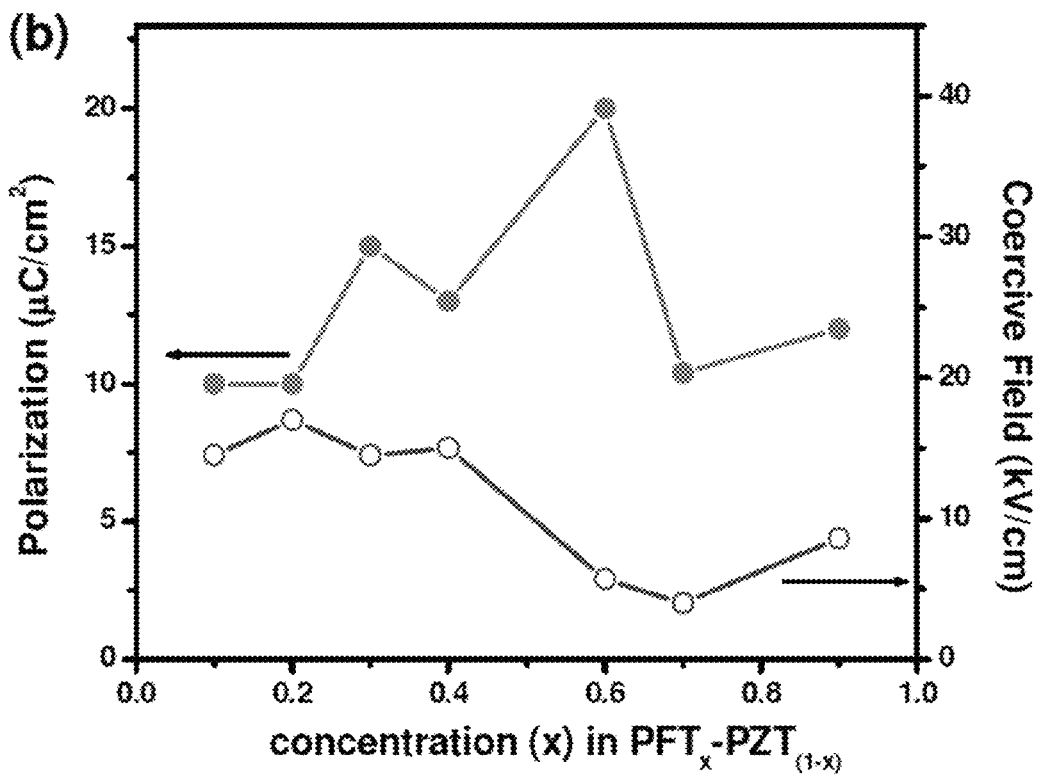

The electric field induced polarization switching (P-E) behavior was studied at low frequency (50 Hz) utilizing Sawyer-Tower measurements. Plot (a) of FIG. 2 shows the ferroelectric hysteresis loop for PZTFT for compositions from x=0.1 to x=0.9. The ceramic samples exhibit well-saturated hysteresis loop. The evolution of remanent polarization ($P_r$) and saturated polarization ($P_s$) with the PFT concentration (x) is shown in plot (a) of FIG. 2(b). With increase PFT concentration from x=0.1 to 0.6 in PZTFT the polarization ($P_r$) value increase from ~10 to 19 $\mu C/cm^2$ and maximum coercive field ($E_c$) observed was ~15 kV/cm, however with further increase in x, both $P_r$ and $E_c$ values were reduce to 10 $\mu C/cm^2$ and 6 kV/cm respectively.

The temperature evolution of ferroelectric loop of the $PZT_{0.7}$-$PFT_{0.3}$ favors an orthorhombic to tetragonal phase transition. Well saturated and perfect square loops below to 550 K and an anomalous enhancement above the ferroelectric phase transition ($T_C$=520 K), the enhancement in polarization value near to $T_C$ confirms the orthorhombic to tetragonal phase transition and rules out a higher symmetry cubic phase with zero polarization. This result is in agreement with temperature dependence of Raman and XRD results.

Figure 3:
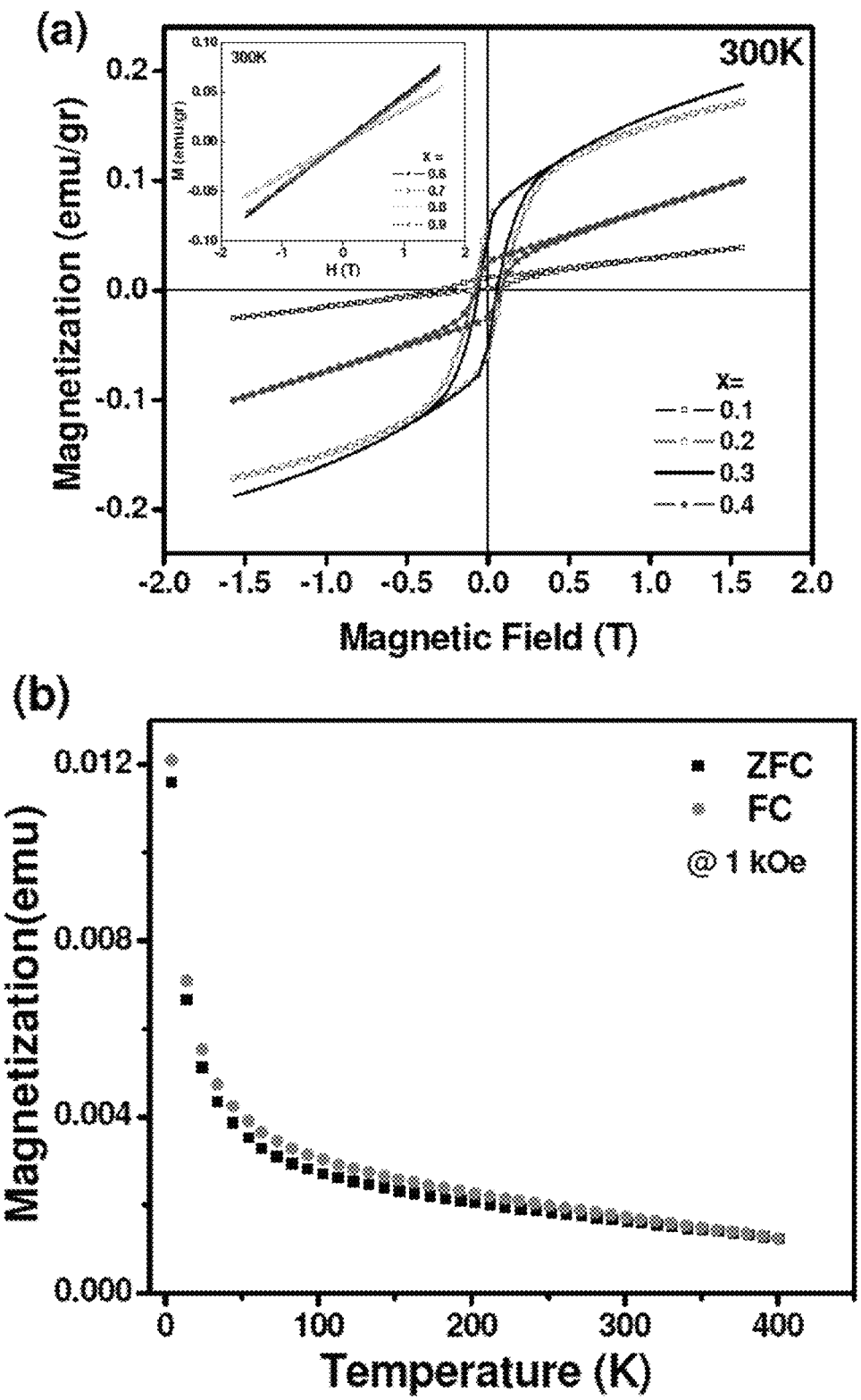
FIG. 3. shows room temperature Magnetization (M)—Magnetic field (H) hysteresis loop of PZTFT for different compositions (0.1≤x≤0.4) of ceramic samples and Zero field cool (ZFC) and field cool (FC) of PZTFT (x=0.30) ceramic at 1 kOe of cooling magnetic field, according to the present invention.

Magnetizations studies of the PZTFT family present well behaved magnetization (M) vs. applied magnetic field (H) loop at room temperature for PFT concentration (x) between 0.1 to 0.4 (see plot (a) of FIG. 3, however for x>0.5 paramagnetic behavior was observed as is shown in plot (a) of FIG. 3. The remanent magnetizations of PZTFT with 0.1≤x≤0.4 oscillate between 0.01 and 0.07 emu/gram, these values are comparables to the known room temperature multiferroic including $BiFeO_3$ and another lead based multiferroic relaxors. The magnetic loop measurement was carried out using SQUID and VSM at different lab at ambient conditions to avoid the possibilities of contamination of the samples. Some critical points are emphasized as follows: 1) the signal is strong so would need large contamination to have an effect, 2) Sample was rotated in SQUID and no changes were seen in magnetization; thus any alien body must be completely homogeneously distributed.

However as we mention previously with increase in PFT contents (x≥0.6), this system do not show magnetic loop. We have done careful detailed magnetic study of the system and repeated the measurements with samples synthesized at different times with the same results. This indicates that, only for a given percentage of PFT, the magnetic ordering is activated.

Plot (a) of FIG. 3 shows the zero field cool (ZFC) and field cool (FC) data of PFT-PZT (x=0.3). These show nonlinear non-zero magnetization up to room temperature; magnetic irreversibility ($M_{irr}=M_{FC}-M_{ZFC}$) especially for low ZFC persists for wide temperature regions to $4^{th}$ or $5^{th}$ order of the magnitude. A sharp increase in magnetization was observed below 50 K. Neels temperature ($T_N$) related to the original PFT was not observed in ZFC and FC magnetization curve suggests the existence of super-antiferromagnetic and/or super-paramagnetic clusters far above the ambient temperature. Actually both super-paramagnetic cluster model and super-antiferromagnetic cluster model are used to explain the possible presence of weak magnetism in the lead based multiferroics. R. An electron paramagnetic resonance (EPR) experiment on lead iron niobate (PFN) ceramic explains the presence of weak magnetization above Neel temperature in context of super paramagnetic cluster model. The explanation of observed weak magnetization in M vs H curve or ZFC-FC data in PFN, PFT, or PFW (same class) materials was first given by Prof. Smolenskii, they explained on the basis of super-exchange interaction at B-site octahedral and also spin canting. The existence of magnetization above the Neel temperature in sol-gel prepared PFN ceramic had explained on the basis of spins canting and super-paramagnetic ions cluster. Peng et al. in PFN—Pb(Mn,W)$O_3$ system explains the existence of magnetization on superantiferromagnetic (SAF) model. Still the observation of weak magnetization in the lead based frustrated system is very poorly understood. We have not observed any noticeable anomaly near the $T_N$ of PFT for investigated solid solution, although, Martinez et al. observed very weak anomaly near Neel temperature for polycrystalline PFT ceramics.

Figure 4:
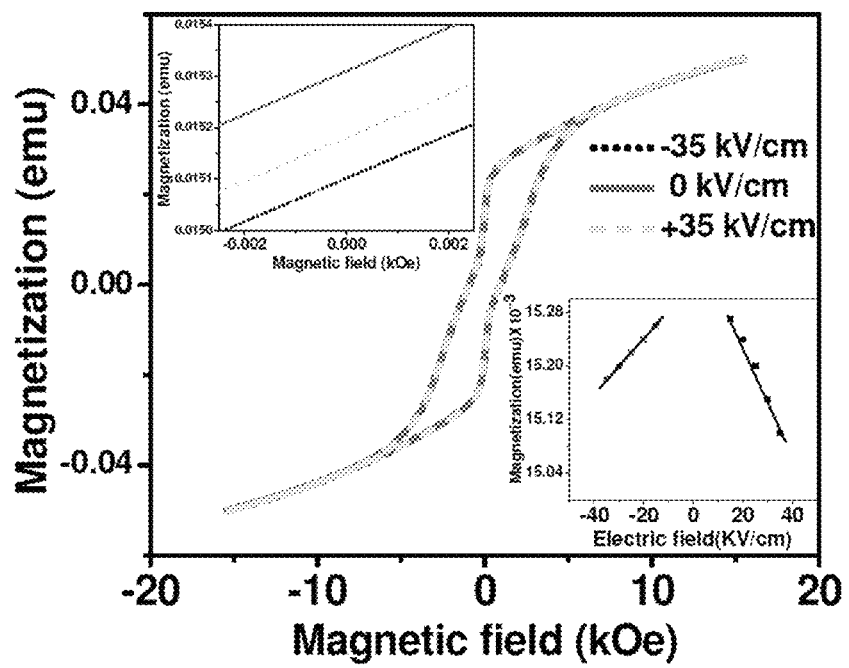
FIG. 4. shows a plot of electric control of PZTFT (x=0.3) magnetization that showed moderate ME coupling, according to the present invention.

The magnetoelectric coupling was measured using two different procedures:

1. Effect of magnetic field on electrical properties: FIG. 4 shows moderate electric control of remanent magnetizations and coercive field of PZTFT ceramic with LSMO and silver paste as electrodes. The step-like behavior observed in M-H curve is due to ferromagnetic and antiferromagnetic coupling at the interface of LSMO/PZTFT. The remanent magnetization (M) changes by ΔM=0.0021±0.0002 emu and magnetic coercive field by 50-100 Oe under the application of a modest electric field ΔE=35 kV/cm. Under the application of an external electric field (±$E_e$), a significant amount of remanent magnetization was changed. Magnetoelectric coefficient (α) were calculated from the change in magnetization (ΔM) (under 50 Oe) under applied external electric field (ΔE). The α value obtained using the equation (1) was $1.3\times10^{-11}$ s/m.

$$\alpha = \mu_0 \frac{\Delta M}{\Delta E} \quad (1)$$

The effect of positive and negative electric field on remanent magnetization and the linear relation followed for the changes in magnetization under applied electric field are showed in the insets of FIG. 4. These results suggest Polarization×Magnetization (PM) coupling in PZTFT multiferroic ceramic material. The present ME values are comparables than the value obtained for the single phase $Cr_2O_3$, α=4.1× $10^{-12}$ s/m and other single phase multiferroic materials.

Figure 5:
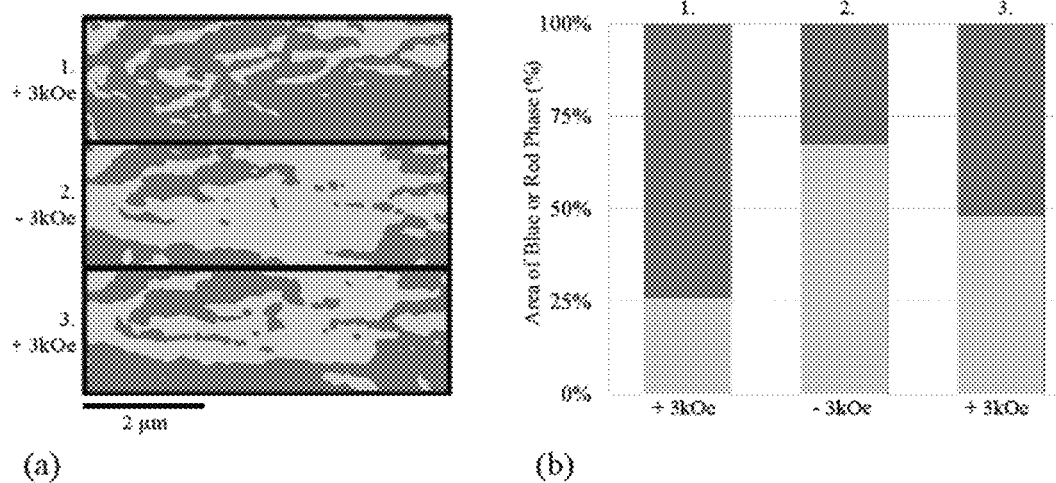
FIG. 5. shows piezo force microscopy (PFM) map of the ferroelectric domains under the influence of the magnetic field and histogram of the percent of the different phase colors, according to the present invention.

2. FIG. 5 show the PFM map of the ferroelectric domains under the influence of the magnetic field. Region 1 of plot (a) of FIG. 5(a) show PFM phase image of the PZTFT (x=0.4) lamella after application of a magnetic field of (3 kOe=0.3 T) perpendicular to the imaged surface and then removed prior to imaging. The resulting in-phase and anti-phase domains are present by blue and red colors. Region 2 of plot (a) of FIG. 5(a) show the changes in PFM phase image when the magnetic field was reversed (−3 kOe=−0.3 T), the population of ferroelectric domains with orientations yielding in red color decrease, while those mapped by blue phase increase. When the original magnetic field (3 kOe) was again applied changes in the domain distribution were significantly reversed (see Region 3 of plot (a) of FIG. 5(a)), clearly changes in the ferroelectric domain configuration were induced. Plot (b) of FIG. 5 presents the percentage of blue and red phase for different orientation of magnetic field applied; it is clear that magnetically-induced ferroelectric domain configurations in PZTFT can certainly be altered by applying magnetic fields, the reversible nature of the magnetoelectric coupling is an extremely important observations. The $\alpha_{13}^{eff}$ value can be calculated if the net electrical displacement in the region imaged in plot (a) of FIG. 5 is taken to be proportional to the difference between the population domains with opposite lateral polarization components (area fraction of red minus area fraction of blue), then the change in this relative domain fraction, as a function of the change in the magnetic field applied, can be determined. For the change in field of 6 kOe (+3 kOe changing to −3 kOe and vice versa), the average change in polarization was found to be 60% of that of the fully poled state (all domains the same color). By assuming that the maximum electrical displacement in this fully poled state is of the order of 10 μcm$^{-2}$, we obtain an effective $\alpha_{13}^{eff}=1.3\times10^{-7}$ sm$^{-1}$.

EXAMPLE 2

Preparation and Properties of (PbZr$_{0.53}$Ti$_{0.47}$ $O_3$)$_{(1-x)}$—(PbFe$_{0.5}$Ta$_{0.5}$O$_3$)$_x$ Thin Films by Pulsed Laser Deposition Materials and Methods Ceramic targets of (PbZr$_{0.53}$Ti$_{0.47}$O$_3$)$_{(1-x)}$—(PbFe$_{0.5}$Ta$_{0.5}$O$_3$)$_x$ (0.1≤x≤0.9) with 10% excess of lead oxide (to compensate the loss of Pb due its volatility) were synthesized by a conventional solid-state route. Four different compositions of PZTFT (0.1≤x≤0.4) films were fabricated on conducting (bottom electrode for all electrical measurements) La$_{0.67}$Sr$_{0.33}$CoO (LSCO) coated (100) MgO substrate by pulsed laser deposition technique using a excimer laser (KrF, λ=248 nm). The conducting LSCO layer was grown on MgO substrate at 873 K under an oxygen pressure of 300 mT, using a laser energy density of 1.8 J/cm² and repetition rate of 10 Hz, followed by normal cooling in oxygen atmosphere (300 Torr). The PZTFT layer was then deposited on the LSCO layer at 873 K under an oxygen pressure of 200 mTorr, using a laser energy density of (1.5 J/cm²) and repetition rate of 10 Hz. The PZTFT ($0.1 \leq x \leq 0.4$) was annealed at 873 K for 60 minutes in oxygen at a pressure of 300 Torr. Finally, the films were cooled down to room temperature at a 5 K/minute and 300 Torr of oxygen pressure. The orientation and phase purity of the films were characterized by x-ray diffraction (XRD) using Cu Kα radiation in a Siemens D500 diffractometer in a θ–2θ scan. Dielectric measurements (capacitance and loss factor) were measured in the temperature range of 100 to 600° C. for frequency between 100 Hz to 1 MHz by using a programmable temperature controller (MMR K-20) and an impedance analyzer (HP 4294A). Ferroelectric hysteresis loop were performed at room temperature using a hysteresis loop tester (Radiant Technologies RT6000 HVS) at 50 Hz in a voltage range from 100 V to 500 V. For electrical measurements, circular capacitors were fabricated by dc sputtering with Pt as top electrodes with area of ~3×10⁻⁴ cm² utilizing a shadow mask. Bottom electrodes were fabricated with conducting LSMO on (001) MgO, using PLD technique. Magnetic measurements were carried out using a Quantum Design MPMS XL-7 SQUID magnetometer. The sample was placed in a standard drinking straw sample holder and the sample space was evacuated multiple times to ensure complete removal of air by displacing it with He.

Results

Figure 6:
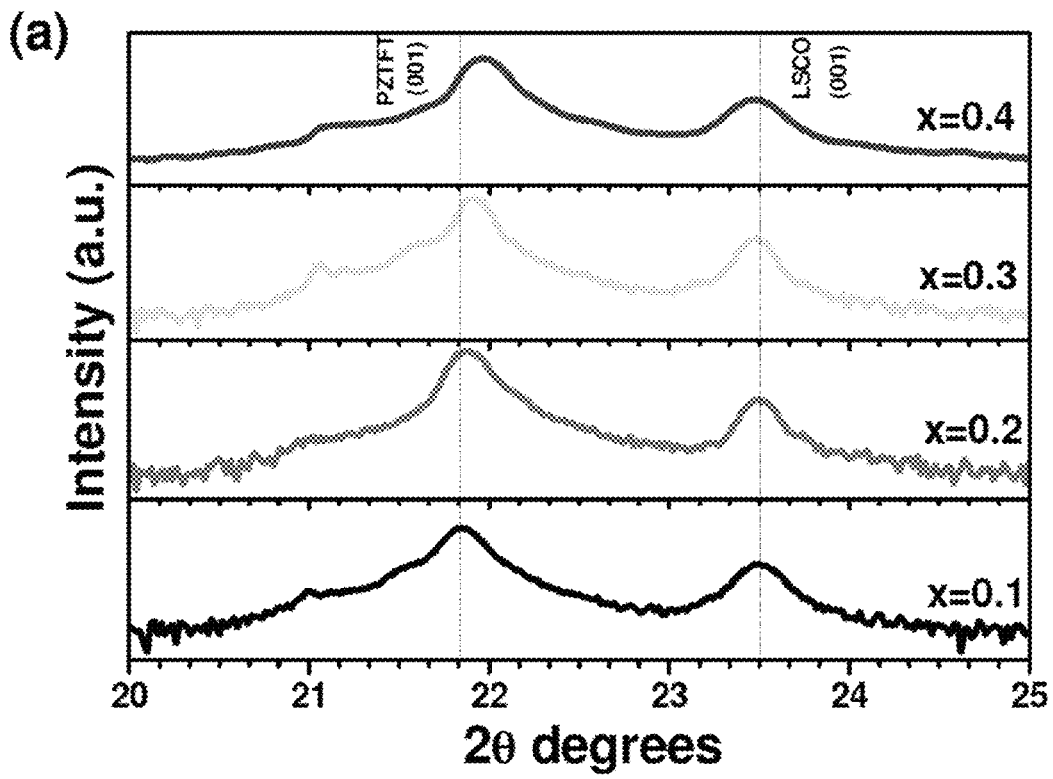
FIG. 6. shows X-ray diffraction patterns of PZTFT thin films for different compositions (0.1≤x≤0.4), according to the present invention.
Figure 6:
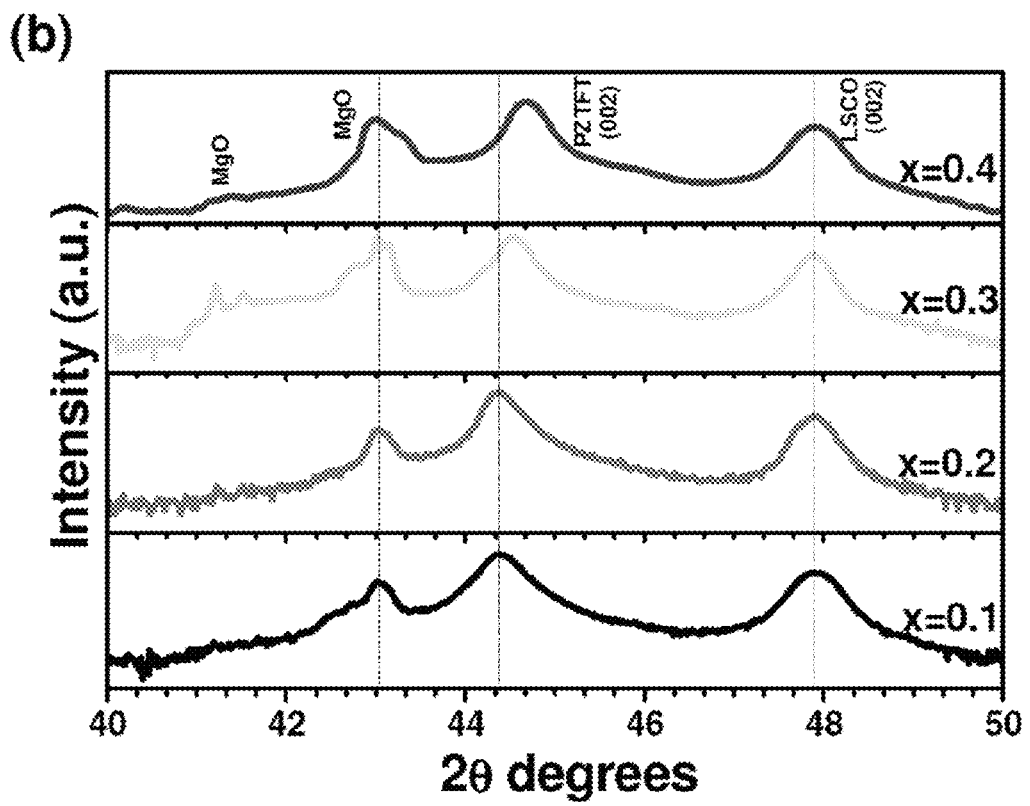
Figure 7:
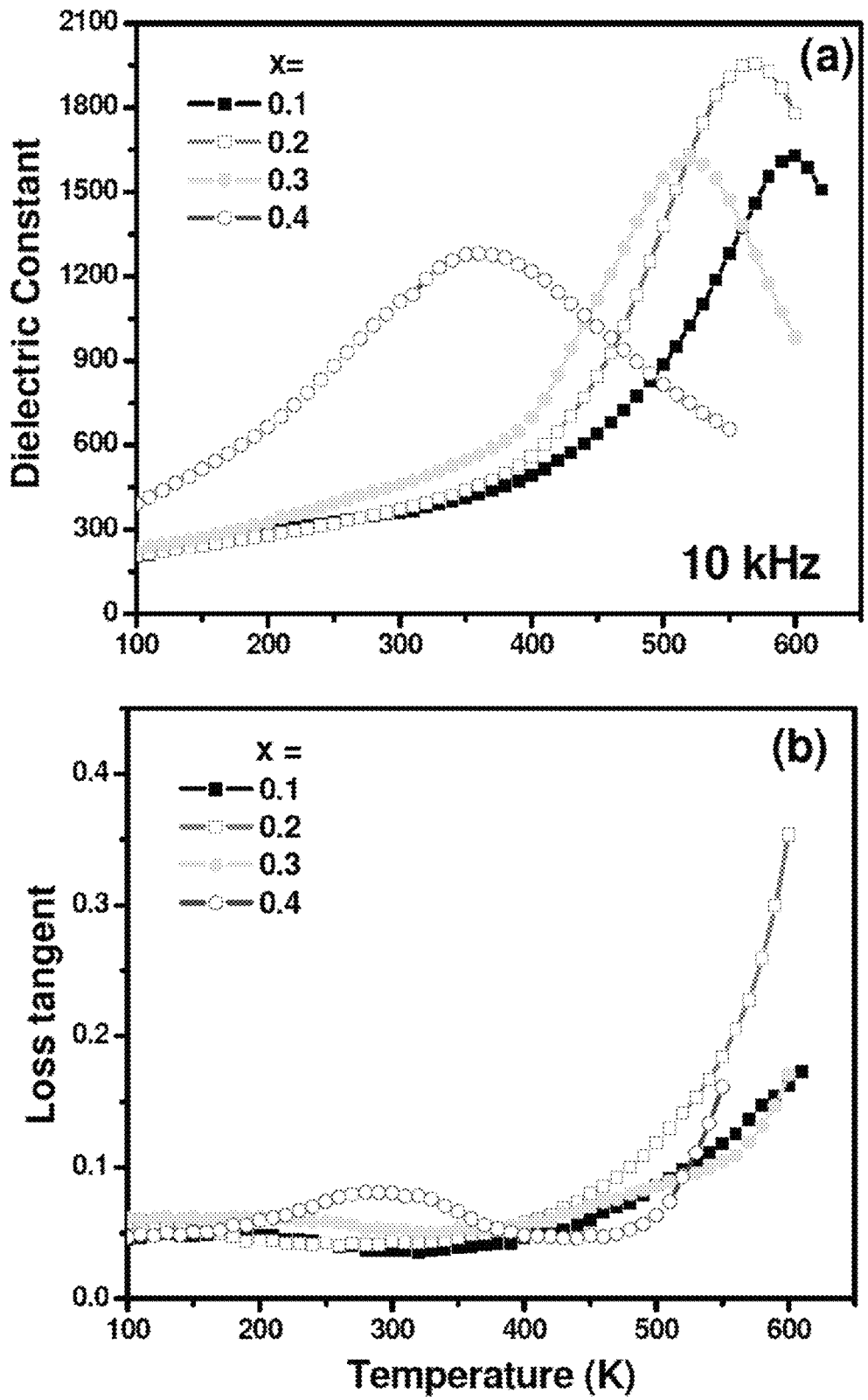
FIG. 7. shows temperature dependence of the dielectric constant and loss tangent of PZTFT thin films for different compositions (0.1≤x≤0.4) at 10 kHz, according to the present invention.

X-ray diffraction patterns indicate the films are single phase with perovskite structure. They are highly oriented along the substrate plane, with less than 0.5% of PZFT and LSCO in (011) direction. Plots (a) and (b) of FIG. 6 show the XRD spectrum of (001) and (002) peaks corresponding to PZTFT, LSCO and MgO. The peaks position corresponding to LSCO and MgO (substrate) are not change with the variation of PZT and PFT compositions; however the peak positions of PZTFT compounds were shifted towards higher Bragg angles with increase of PFT concentration, that is, with increase of Fe and Ta compositions. This behavior could be due occupation in some percent in the perovskite octahedral of Fe (58.8 pm) and Ta (68 pm), instead of Zr (72 pm) and Ti (60.5 pm), since the average ionic radii of the first two compounds are smaller compared to the last two, indicating a reduction in the unit cell parameters of the PZTFT compounds when the x (PFT) value increase.

Plots (a) and (b) of Figures present the curves of dielectric permittivity and los tangent vs temperature at 10 kHz for PZTFT with $0.1 \leq x \leq 0.4$ compositions. The most important features of effect of x (PFN) increase in PZTFT thin films are as follows: (i) The ferroelectric phase transition shift from higher temperature (597 K, x=0.1) towards to low temperature (361 K, x=0.4); (ii) for all solid solution thin films the loss tangent (tan δ), below to 450 K was less than 0.1, a rapid increase in tan δ with temperature was observed above Tc, depending upon the composition, until a maximum value of 0.35, (iii) for composition x≤0.3, the dielectric constant show a peak at 597 K, 569 K, 518 K for x=0.1, 0.2 and 0.3 respectively, which are independent of frequency and it is attributed to the ferroelectric phase transition; (iv) for x=0.4 ferroelectric relaxor behavior was observed i.e. frequency dispersion (~30 K), shift in dielectric maxima temperature towards higher temperature side with increase in frequency. Real and imaginary dielectric data were fitted with a nonlinear Vogel-Fulcher equation, implying a relaxor nature. The noticeable increase in tan δ accompanied by the frequency dispersion in PZTFT is considered to occur due to the nature of the iron-containing lossy ferroelectrics. The existence of the Fe ion, which is a transition element, may be responsible for the increasing ionic conduction, resulting in the increase in tan δ at higher temperatures.

Figure 8:
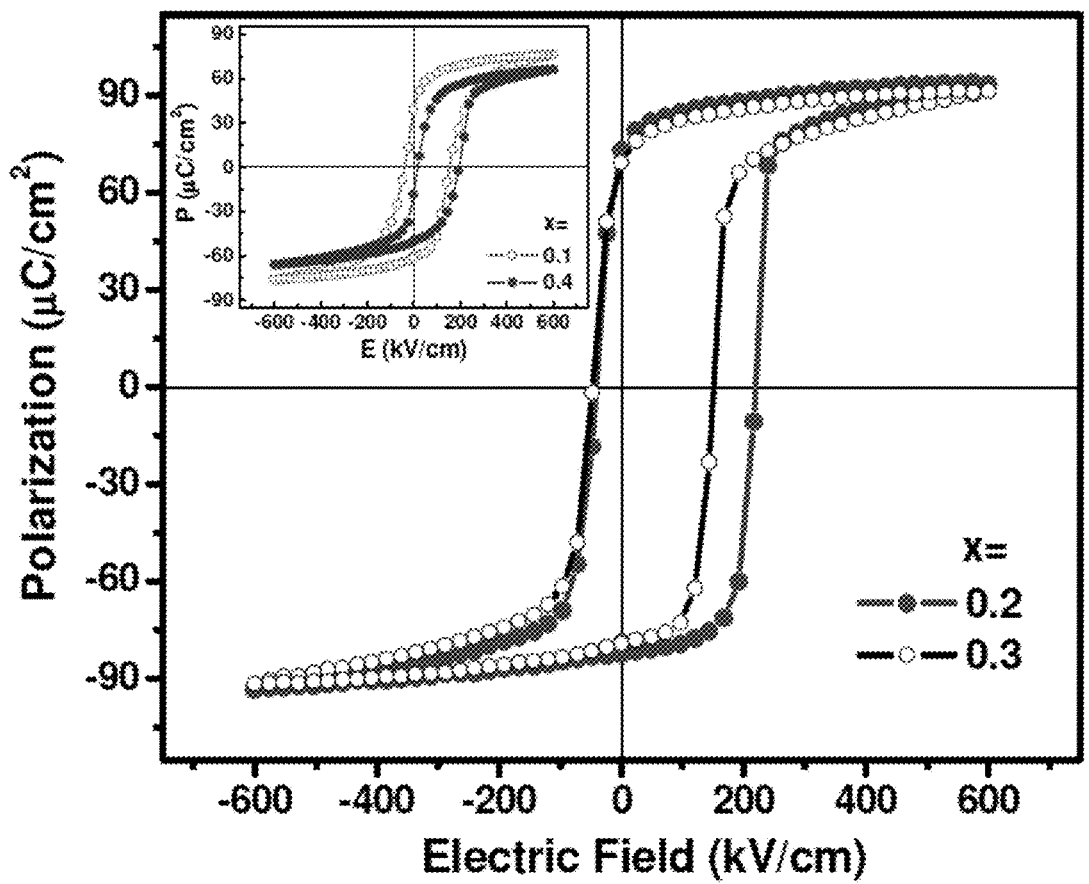
FIG. 8. shows room temperature ferroelectric hysteresis loop of the PZTFT thin films for x=0.2 and 0.3, according to the present invention.

The electric field induced polarization study was carried out at operating frequency ~50 Hz utilizing Sawyer-Tower circuit. FIG. 8 show the ferroelectric hysteresis loop of PZTFT at room temperature for x=0.2 and 0.3, in the inset x=0.1 and 0.4 are presented. These films exhibit well saturated and defined hysteresis loop with high remanent polarization ($P_r$), with $P_r$ values of about 57, 77, 78, 43 μC/cm² and coercive field of 95, 123, 97, 90 kV/cm for x=0.1, 0.2, 0.3 and 0.4 respectively, at 550 kV/cm external electric field. The highest values of remanent polarization were obtained for x=0.2 and x=0.3, the possible explanation of these results can be due the balance occupancy of the four elements (Zr, Ti, Fe, Ta) in the synthesized complex single-phase perovskite octahedral accompanied with a favorable lattice mismatch with the substrate and the films (bottom and dielectric layer) that can facilitate the higher ferroelectric properties. On the other hand characteristically, asymmetric polarization switching (different up- and down-switching processes) of the ferroelectric loop was also observed. The imprint may be due to several reasons: (i) different work function of the dissimilar top and bottom electrodes (Pt and LSCO); (ii) development of built-in internal stress across the interlayers; and (iii) Domain pinning induced by, e.g., oxygen vacancies, or (iv) degradation of ferroelectric properties in film/electrode surface layers.

Figure 9:
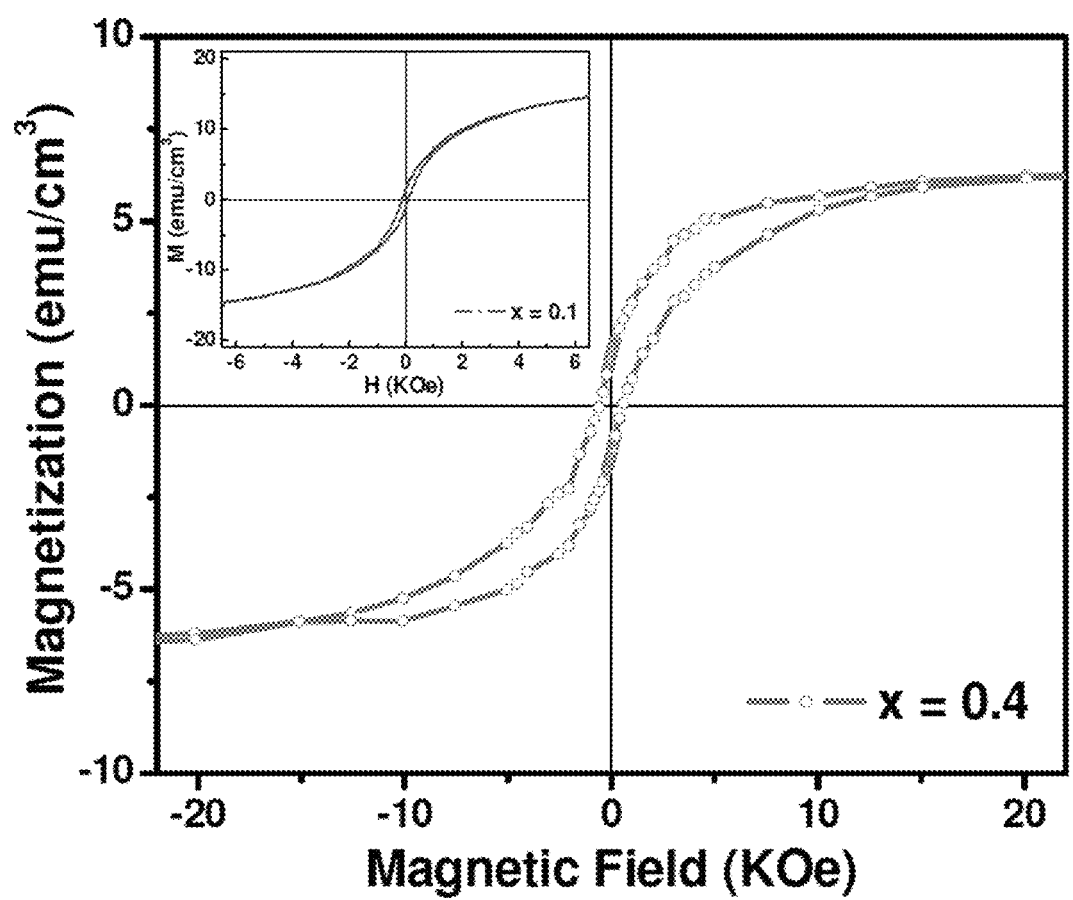
FIG. 9. shows room temperature ferromagnetic hysteresis loop of the PZTFT thin films for x=0.4, according to the present invention.

The ferromagnetic properties of the PZTFT thin films, deposited without bottom electrode layer, to avoid magnetic contribution from LSCO, was demonstrated from the magnetic hysteresis loop (M-H) measured at 300 K for x=0.1 and 0.4, as is shown in FIG. 9. The average saturated remanent magnetization ($M_r$) and coercive field ($H_c$) are ($M_r$=1.47 emu/cm³, $H_c$=0.1 kOe) and ($M_r$=1.58 emu/cm³, $H_c$=0.6 kOe) for x=0.1 and x=0.4 respectively. To understand the origin of magnetism; we need deeper and extensive studies.

Observation of weak magnetism in PZTFT thin film can be explained in the light of the presence of $d^n$ ions at B– site which may provides in plane ferromagnetism. As discussed in previous works, a super exchange in the disordered regions through $Fe^{+3}$—O—$Fe^{+3}$ is expected. The strain in the film cause a small distortion in the $Fe^{+3}$—O—$Fe^{+3}$ spins may also confer weak ferromagnetism. R. Blinc et al proposed a super-para magnetic model for $PbFe_{0.5}Nb_{0.5}O_3$ which belongs to the same family of material and its magnetic phase transitions are similar to PFT. They found small internal magnetic field that is small but nonzero even at room temperature, and spin-spin exchange in terahertz frequency. In present case, four transition metals are at B-site in which $Fe^{3+}$ ions is $d^+$ state where as others are $d^0$ states, these ions microscopically balance the valence but hop locally in different way which in turns also give unexpected magnetic moments.

Although the present invention has been described herein with reference to the foregoing exemplary embodiment, this embodiment does not serve to limit the scope of the present invention. Accordingly, those skilled in the art to which the present invention pertains will appreciate that various modifications are possible, without departing from the technical spirit of the present invention.

We claim:

1. A room-temperature magnetoelectric multiferroic composite material comprising: $(PbZr0.53Ti0.47O3)(1-x)$-$(PbFe0.5Ta0.5O3)x$ where $0.1 \leq x \leq 0.9$.

2. The composite material of claim 1, comprising a single-phase in an individual grain.

3. The composite material of claim 1, comprising a phase transition from orthorhombic to tetragonal for x=0.3 and tetragonal to cubic for x=0.4.

4. The composite material of claim 1, comprising a remanent polarization in the range of 10-20 μC/cm2.

5. The composite material of claim 1, comprising a dielectric loss in the range of 0.024 to 0.11 at 1 kHz.

6. The composite material of claim 1, comprising a dielectric constant in the range of 630 to 1100 at 1 kHz.

7. The composite material of claim 1, comprising a dielectric constant ~3000 at 1 kHz for x=0.8.

8. The composite material of claim 1, comprising a remanent magnetization in the range of 0.01 and 0.07 emu/gr for $0.1 \le x \le 0.4$.

9. The composite material of claim 1, comprising magnetoelectric coupling $\sim 1.3 \times 10^{-11}$ s/m, for x=0.3 in the bulk; and effective coupling of $\sim 1.3 \times 10^{-7}$ s/m in lamella for x=0.4.

10. The composite material of claim 1, comprising magnetoelectric effect in the presence of magnetic field for x=0.4.

11. The composite material of claim 1, fabricated as thin film using pulsed laser deposition method, said method comprising:
   depositing a (PbZr0.53Ti0.47O3)(1-x)-(PbFe0.5Ta0.5O3)x, $0.1 \le x \le 0.9$ layer from a ceramic target on a substrate;
   annealing the deposited PZTFT layer; and
   cooling the annealed layer.

12. The composite material of claim 11, wherein said deposited PZTFT layer is annealed at 873 K for 60 min under a oxygen pressure of 300 Torr; and
   the annealed layer is cooled to 296 K at a rate of 5 K/min;
   the (PbZr0.53Ti0.47O3)(1-x)-(PbFe0.5Ta0.5O3)x, $0.1 \le x \le 0.9$ layer is deposited from the ceramic target at a temperature of 873 K under an oxygen pressure of 200 mTorr using laser energy of 1.5 J/cm2 at a repetition rate of 10 Hz; said substrate is MgO; and said thin film has a total thickness of at least 350 nm.

13. A room temperature magnetoelectric switch suitable as memory storage with an electric voltage for WRITE operation and magnetic property for READ operation and vice-versa comprising the composite material of claim 1.

* * * * *